US006473662B2

United States Patent
Lübbe et al.

(12) United States Patent
(10) Patent No.: US 6,473,662 B2
(45) Date of Patent: Oct. 29, 2002

(54) SIGNAL COMPRESSOR FOR AUDIO APPARATUS

(75) Inventors: Jürgen Lübbe, Jacobneuharting (DE); Johann Henkel, Rosenheim (DE); Peter Kirchlechner, Hohenthann (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/332,294

(22) Filed: Jun. 11, 1999

(65) Prior Publication Data

US 2001/0055400 A1 Dec. 27, 2001

(30) Foreign Application Priority Data

Jun. 12, 1998 (DE) ......................................... 198 26 389

(51) Int. Cl.[7] ............................. G06F 17/00; H03G 3/00
(52) U.S. Cl. ......................... 700/94; 381/104; 381/106; 381/107
(58) Field of Search ................................. 381/104, 106, 381/109, 107; 700/94

(56) References Cited

U.S. PATENT DOCUMENTS

| 4,170,720 A | * | 10/1979 | Killion ........................ 381/321 |
| 4,628,526 A | | 12/1986 | Germer ......................... 381/57 |
| 5,394,476 A | * | 2/1995 | Rollins et al. ............... 381/104 |
| 5,633,939 A | * | 5/1997 | Kitani et al. ................. 381/106 |
| 5,892,834 A | * | 4/1999 | Smart et al. ................. 381/106 |
| 6,088,461 A | * | 7/2000 | Lin et al. ..................... 381/104 |

FOREIGN PATENT DOCUMENTS

DE            33 20 670 A         1/1984

\* cited by examiner

*Primary Examiner*—Xu Mei
(74) *Attorney, Agent, or Firm*—Lisa K. Jorgenson; E. Russell Tarleton; Seed IP Law Group PLLC

(57) ABSTRACT

A method of signal compression of a signal to reduce the large dynamic range, for example, of the output signal of a CD player in such a way that soft passages of a piece of music are reproduced in somewhat louder manner and very loud passages of a piece of music some are reproduced in somewhat less loud manner. The signal compression circuit used therefor can be integrated completely. The audio signal is fed over a volume control, which can be adjusted by the user, and to this end, a digital setting signal in accordance with the adjustment made on the user side, is supplied via a bus line. When the audio signal is strongly increasing, a tracking signal is formed of said signal, with the amplitude thereof being dependent on the medium amplitude of the audio signal. A window comparator compares the tracking signal with a reference value, as a consequence of which the contents of the up/down counter are reduced. This reduced value is added via an adder to the digital setting signal for the volume control. In the case of strong audio signals, a relatively small value corresponding to the count of counter is added to the digital setting signal. In the case of weak signals, a relatively high value is added.

24 Claims, 1 Drawing Sheet

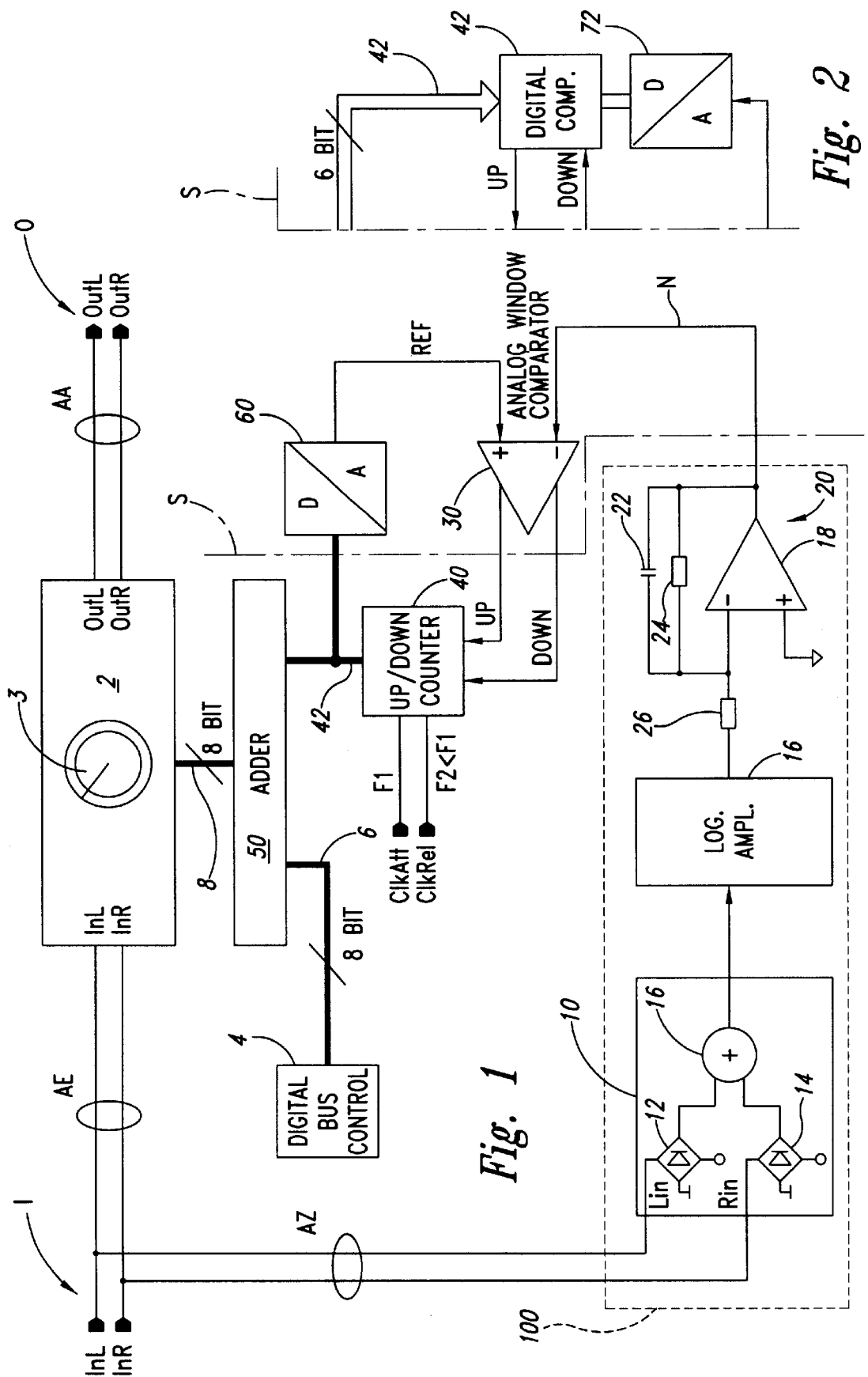

SIGNAL COMPRESSOR FOR AUDIO APPARATUS

TECHNICAL FIELD

The invention relates to a signal compressor for an audio apparatus, in particular a motor vehicle audio apparatus, which contains a volume control that is inserted in the audio signal path and is adjustable via a digital setting signal delivered by a digital controller.

BACKGROUND OF THE INVENTION

With mass-produced articles, such as e.g., audio equipment for motor vehicles, which contain at least a radio along with a cassette unit and a CD unit, it is desirable to combine as many circuit parts as possible in an integrated circuit for the reduction of space and production costs. Integrated circuits can be equipped also with features that facilitate handling and improve the sound pattern.

While numerous individual components of an audio apparatus can be combined in an audio processor, there are still certain functions realized as before through discrete components or component groups that could not be designed as an integrated circuit.

The present invention is concerned with signal compression for the dynamic compression of audio signals. Depending on the nature of the memory medium, audio signals, in particular for instance with classic music, have a large dynamic range (e.g., up to about 85 dB). This large dynamic range reflects essentially the situation in a concert hall. In a piece of music, there are very soft passages and extremely loud passages. While the true reproduction of these very soft and very loud passages of a piece of music is desirable as such, the high dynamic range in case of motor vehicle audio equipment and other equipment operated in environments with high background noise level frequently results in undesirable effects. For example, soft passages almost cannot to be heard because of the high background noise level, while loud passages are felt as disturbing, particularly when they distract from another activity, e.g., the driving of a motor vehicle.

For this reason it is already known to provide an audio apparatus with a signal compressor, which reduces the very large dynamic range of the audio signal, e.g., from 85 dB to 60 dB. The effect of such a signal compressor consists in that the loudness is increased in very soft passages of a piece of music, while the loudness in very loud passages is decreased.

The applicant has already developed a signal compressor that is used together with an audio processor operating in digital fashion to the largest possible extent. For example, by means of a signal compressor connected upstream of the audio processor, the non-compressed output signal of a CD apparatus (compact disk apparatus) is fed to the signal compressor, compressed therein, and the compressed output signal is fed to the audio processor.

These previous signal compressors were designed as circuits operating in an analog manner. To obtain the desired signal compression of the analog signal, resistors and capacitors were used. Such components, which were usually employed as external components, in addition to integrated components, are contrary to mass production at low costs.

To convert the non-compressed signal to a compressed signal, typically an analog multiplication of the non-compressed analog signal by an appropriate factor is carried out.

What is disadvantageous with the known multiplier is, however, that the compressed signal obtained displays a strong distortion, in particular with input signals of high level.

Since the known signal compressor designed as a separate component displays a series of active signal processing stages, the signal to noise ratio (S/N ratio) of the signal deteriorates, particularly at low signal levels.

SUMMARY OF THE INVENTION

The invention is directed to providing a signal compressor for an audio apparatus in which the desired signal compression can be realized using a comparatively fewer number of components. In particular, space is saved by saving components of the entire audio apparatus, and the production is less expensive.

The invention achieves a reduction in the harmonic distortion and noise inevitably created with conventional signal compressors.

The invention provides a signal compressor of the type indicated at the outset, which has the following features:

a) the audio signal is branched off from the audio signal path upstream of the volume control and is processed by a signal processing circuit so as to form a tracking signal that is dependent on the intensity of the audio signal;

b) the tracking signal is compared in a comparator with a reference value;

c) depending on the comparison result, a counter designed as up/down counter is increased or decreased; and d) the contents of the counter are linked with the digital setting signal before the setting signal is fed to the volume control.

A favorable prerequisite for the invention is an apparatus having a volume control that is adjusted by a digital setting signal. Such a volume control has already been developed by the applicant (DE-A-195 27 338). In this volume control the level of the analog audio signal at the input of the volume control is changed on the basis of a digital setting signal, such that when there is a change in volume, a soft or smooth signal transition without any "clicking noise" results. When the digital value of the setting signal changes (which can happen suddenly), the audio signal at the output of the volume control normally would perform an amplitude jump, which expresses itself as a "clicking noise" to a listener. The effect achieved by the measures described in detail in said DE-A-195 27 338 is that this signal transition at the output of the volume control takes place in a soft and smooth manner, so that the undesirable clicking noise is avoided.

The known volume control has a digital input for a digital setting signal. In the invention this digital setting signal is modified depending on the level of the audio input signal. The tracking signal dependent on the level of the audio signal upstream of the volume control is compared with a reference signal, and depending on the comparison result, the count of an up/down counter is changed. The contents of the counter then are linked in suitable manner with the digital setting signal.

The various linking types possible are described in more detail further below. One advantage of the invention is that very weak levels of the audio signal cause the volume control to change the signal towards a higher volume, while at high levels of the audio signal, the volume control performs a change in the audio signal in the sense of a volume reduction.

As will be described in more detail below, the components of the signal compressor can be designed completely as an integrated circuit. Due to the fact that use is made in part of already existing components in the audio processor, considerable space is saved for the circuit on the circuit board as compared to earlier designs, i.e., a signal compression with the aid of an independent signal compressor.

Because no multiplication of analog signals is required, the audio signal changed in intensity has little, if any, detectable distortion. As there are no additional components necessary in the signal path proper, the signal to noise ratio is not affected.

The aforementioned linkage of the digital setting signal with the contents of the counter can be accomplished in different ways. In one embodiment, an adder is provided that receives on its first input the digital setting signal and has a second input coupled with the output of the counter, the counter having its count raised by the output signal of a comparator when the tracking signal corresponds to a reduced level of the audio signal.

To elucidate the operation of this specific embodiment comprising the adder, some numerical examples shall be used: When the digital setting signal for the volume control has 8 bits, there are theoretically 256 volume levels possible. It shall be assumed that the volume control is set to the level "100", i.e. that the digital setting signal is the binary representation of the decimal value "100". When the up/down counter has six digits, the contents thereof can represent any value between 0 and +63. When the audio signal has a medium level, the contents of the counter correspond, e.g., for example, to the value "30". By addition to the above-mentioned value "100", the volume control then is actually set to a value of "130".

When the audio signal has a very weak level, a correspondingly lower tracking signal is formed, which e.g., is lower than the reference signal, whereby the output signal of the comparator increases the contents of the counter in corresponding manner. The extent of the increase of the counter depends on how low the level of the audio signal decreases. At extremely low levels of the audio signal, the counter is increased in correspondingly great manner, at maximum to the value "63". This value "63" is added to the aforementioned value of "100", so that the volume control actually sets a volume corresponding to the value "163".

In case of very high levels of the audio signal, the counter is operated in such a manner that its count becomes lower. As a result, the volume control then delivers a signal corresponding to the set value of "100" in the extreme case, i.e., the value of the digital setting signal.

The foregoing can also be achieved when, in a further embodiment of the invention, a subtractor is used instead of the adder. In this case, the count of the counter is decreased in response to a very low level of the audio signal. The subtraction carried out by the subtractor, in case of weak levels of the audio signal, results in an only minor reduction of the numerical value corresponding to the digital setting signal, so that weak audio signals are relatively increased. In contrast, with strong audio signals at the input of the volume control, a correspondingly high value is subtracted from the digital setting signal, attenuating the high volume.

Other modifications and embodiments are possible for linking the digital setting signal with the output signal of the counter. For example, a digital multiplication can be carried out. At medium signal levels of the audio signal, the value of the digital setting signal then would be left more or less unchanged (multiplication factor "1"); whereas at low signal levels of the audio signal, an increase in volume would be obtained (multiplication factor between 1.01 and 1.15). At very high audio signal levels, the multiplication would lead to a reduction in volume (multiplication factor e.g., between 0.85 and 0.99).

To obtain a "sliding" compression of the input audio signal in the entire level range, the invention provides a comparator designed for analog signal processing with one input connected via a D/A converter to the output of the counter and another input connected to the output of the signal processing circuit. The reference signal compared by the comparator to the tracking signal thus corresponds to the current count of the up/down counter. With an extremely weak audio signal, for instance, the tracking signal is higher than the reference signal, as a result of which the count is increased (if an adder is connected downstream thereof). This also increases the value of the reference signal. Subsequently, a further increase in count takes place as long as the tracking signal is higher than the reference signal. Due to the step-like increase of the reference signal, a condition is finally reached in which the tracking signal is lower than the reference signal, so that the count then is no longer increased.

Instead of converting the count of the digital counter to an analog signal and then feeding this analog signal as a reference signal to the comparator along with the analog tracking signal, another preferred embodiment of the invention provides a comparator designed as a digital signal comparator with one input connected via an A/D converter to the output of the signal processing circuit and another input connected to the output of the counter. This circuit with the comparator operating in digital manner delivers essentially the same signals for increasing or decreasing the count of the up/down counter. The above-mentioned signals that are fed to the up/down counter are the signals that determine whether the count is increased or decreased. The counting operation depends on the clock signal fed to the counter. The counter in this respect is designed such that, with different levels of "up" and "down" signals coming from the comparator, a corresponding change of the count by "1" takes place, depending on the clock signal supplied. When the signals "up" and "down" have the same levels, the clock signal effects no counting operation.

Compressing of the dynamic signal range with the aid of the signal compressing circuit according to the invention, of course, should take place in such a manner that the music does not appear strange because of unexpected volume changes. Suddenly occurring high volumes can be undesirable in particular for the driver of a motor vehicle. To avoid this and to obtain a smooth transition as possible in the compressed signal, the invention provides that the output of the comparator is coupled with a counting direction input of the counter and that the counter, depending on whether the audio signal intensity increases or decreases, is clocked with a clock signal having a first frequency and, respectively, with a clock signal having a second frequency that is lower than the first frequency.

The effect achieved thereby is that the level decrease with increasing audio signal is carried out in a shorter period of time than a correspondingly high level increase with decreasing audio signal. The level decrease with increasing audio signal is effected in a shorter period of time, in order to prevent amplitude clipping with strongly increasing audio signal. The level increase with decreasing audio signal is carried out more slowly in order to prevent a pumping effect in case of a strongly changing audio signal. In this way the output signal is smoothed.

The clock signal of the first, relatively high frequency takes care of a strong level rise, and clipping of the signal is prevented. The second, relatively low frequency, which is decisive at a decreasing level, smoothes the output signal, and in particular avoids a pumping effect that takes place with strongly changing signals.

The clock signal for clocking the counter is obtained by an oscillator forming, from a signal of relatively high frequency f1, by division or frequency division a clock signal with a frequency f2 corresponding to a fraction of the frequency f1. Whether the counter is fed with the signal of higher frequency or the signal of lower frequency is dependent on whether the level of the audio signal is increasing or decreasing at the particular time. This circuit for delivering the clock signals is not essential for the understanding of the present invention and shall not be elucidated here in more detail.

According to the invention, a tracking signal is formed of the branched audio signal, which is compared with a reference signal. A particular embodiment of the invention provides that the signal processing circuit used therefor has the following features:

- a rectifier rectifying the audio signal and, if applicable, adding the separate signals for the left and the right channels;
- a logarithmic amplifier connected to the output of the rectifier; and
- a low pass filter at the output of the logarithmic amplifier.

The logarithmic amplifier serves to match the loudness change to the loudness sensation of the human ear. The low pass filter connected downstream of the amplifier smoothes the signal, so that it is suitable for a comparison with the (changing) reference signal.

The comparison between the tracking signal and the reference signal carried out in the comparator is rendered insensitive with respect to residual disturbances in the tracking signal in that a window comparator is used. Such window comparators are known. They deliver a corresponding comparison signal at their output when the signal (here the tracking signal) compared with the reference signal is outside a window, the center of which is formed through the reference signal.

A signal compressor according to the invention can also be employed for so-called "anti-clipping". Clipping is understood to be the effect that, due to too high dynamics or signal intensity, signals exceed level values corresponding to the positive and negative voltage supply values, and undergo amplitude limitation at these voltage supply values. It is usual to form output stages or output power stages with a device delivering a harmonic distortion signal indicating the harmonic distortion. This signal can be fed to the signal compressor according to the invention, by means of which the signal subject to the risk of clipping, depending on the type of the harmonic distortion signal, is decreased when approaching the clipping range and is increased again when this range is left again.

The signal compressor according to the invention can also be employed in connection with noise-dependent volume matching, for instance in a car radio. By means of a microphone, the background noise volume is ascertained and a resulting background noise signal is passed to the signal compressor in order to increase or decrease, or decompress or compress, respectively, the audio signal according to the intensity of the background noise.

BRIEF DESCRIPTION OF THE DRAWINGS

In the description that follows, embodiments of the invention will be described in more detail with reference to the drawings in which:

FIG. 1 shows a schematic diagram of an embodiment of a signal compression circuit according to the invention, and FIG. 2 shows a schematic diagram of an alternative embodiment for the circuit part shown to the right of the broken line S in FIG. 1.

DETAILED DESCRIPTION OF THE INVENTION

In the following, the already known digitally controlled volume control shall be described first, as described in detail in the already mentioned DE-A-195 27 338.

From a CD-player, for example, an analog non-compressed signal, separately for the two stereo channels (L, R), arrives at the input I of the circuit according to FIG. 1. Via the audio signal input line AE, the signal arrives at a volume control 2, which changes the level of the signal received depending on the value of the setting signal supplied thereto via a signal bus 8 having 8 bits. The digital setting signal is dependent on the volume adjustment to be carried out by the user, which is indicated here by a setting knob 3. The conversion of the set value to the digital setting value is not of interest here. The result of each volume control adjustment consists in that a digital bus control 4, via a signal bus 6 having 8 bits and the already mentioned signal bus 8, supplies a digital setting signal to the volume control 2, with the volume control 2 then changing the level of the audio signal depending on the value of the digital setting signal. The output signal of volume control 2 is fed as audio output signal AA to output O having two channels.

The features explained above in connection with FIG. 1 are already known.

In the following, a first embodiment of the signal compressor according to the invention shall be described, which is composed of new combinations of particular components that are known by themselves.

From audio signal input AE, a signal branch AZ is branched off to a peak value rectifier 10 which is contained in a signal processing means 100 indicated by a box in broken lines.

The peak value rectifier contains for the two channels L and R a rectifier 12 and 14, respectively, each. The rectified signals are summed by a summing means 15 and supplied to a logarithmic amplifier 16. The design of the analogously working logarithmic amplifier 16 is known in the technical field concerned and need not be elucidated here in more detail. The amplifier serves for matching the levels of the audio signal to the subjective loudness sensation of the human ear.

The output signal of logarithmic amplifier 16, which is still inflicted with a certain ripple, is passed over a low pass filter (TPF) 20 in order to further reduce the ripples.

The low pass filter TPF 20, just as the rectifier 10 and the logarithmic amplifier 16, is a component part of signal processing circuit 100. Low pass filter 20 consists of an operational amplifier 18 having its inverting input coupled with its output via a parallel connection of a capacitor 22 and a resistor 24. Between the amplifier 16 and the inverting input of the OP amplifier 18, there is disposed a further resistor 26.

The output of the signal processing circuit 100, i.e., the signal at the output of the OP amplifier 18, is referred to as a tracking signal because it changes in accordance with the pattern of the audio signal at the audio signal input AE in inverse relationship to the change of the audio signal. The tracking signal N is a slowly changing signal that is still afflicted with some residual ripples. The tracking signal N is compared by an analog window comparator 30 to a reference signal REF. As long as the tracking signal N is above the window centrically surrounding the reference signal REF, the comparator 30 issues an up-counting signal UP to an up/down counter 40. When signal REF is greater than the tracking signal N, the comparator 30 delivers a down-counting signal DOWN to counter 40.

The reference signal REF is formed of the count of the counter 40, the output of which is coupled via a 6 bit line to a digital to analog converter (D/A converter) 60. In addition thereto, the count of counter 40 is fed to an input of an adder 50, the other input of which is fed from the digital bus control 4 with the digital setting signal via bus line 6.

The up/down counter 40 counts in upward or downward direction in accordance with a clock signal (CLK), depending on whether is receives a high level of the signal UP or a high level of the signal DOWN. The clock signal in alternative manner consists of a clock signal ClkAtt having a frequency f1 or a clock signal ClkRel having a frequency f2, which is lower than the frequency f1.

The reason for different clock signals exists in that the counter, with increasing audio signal, changes its count more rapidly than with a decreasing medium signal level of the audio signal. These circumstances are considered here by the clock signal abbreviations used (ATT=attack=rise; REL=release=decay).

The effect achieved by the two different speed clock signals is that a suppression of high loudness or volume begins more rapidly than increasing of the volume with fading away audio signal.

It shall be assumed in the following that the six-digit counter 40 contains just a medium value "30" between its minimum value "0" and its maximum value "63". Furthermore, the following description of the mode of operation of the circuit shall be based on the case that the audio signal at the audio signal input AE assumes a gradually increasing level in order to remain then on a very high level. The inverse case of a decreasing audio signal then need not be explained in detail because the operation takes place in a similar, although opposite manner.

The relatively high audio signal is supplied via the audio signal branch AZ of the signal processing circuit 100. The peak value rectifier 10 forms a rectified sum signal which is logarithmically amplified by logarithmic amplifier 16. The output signal of the logarithmic amplifier is passed over low pass filter (TPF) 20, and the tracking signal N thus obtained is compared with a reference value REF that was formed by D/A converter 60 from the count "30" in counter 40. Due to the relatively high signal level of the audio signal, the tracking signal N is so low that it is below the window defined by the reference signal REF lying in the window center. Consequently, comparator 30 delivers a down-counting signal DOWN to up/down counter 40, which is decreased then by "1" by the clock signal having the frequency f1. This in turn decreases the reference value REF via D/A converter 60. This process continues until the tracking signal N is in the window of the window comparator.

During the above-outlined process, the count of counter 40 is added continuously via adder 50 to the digital setting signal on line 6, so that the digital setting value supplied to volume control 2 is continuously decreased. In the extreme case, the count of counter 40 reaches its minimum value at very high levels of the audio signal, so that the volume is determined by volume control 2 only in accordance with the digital setting signal from digital bus control 4.

In case the audio signal decreases to a very low level, the tracking signal N in inverse manner thereto increases, so that comparator 30 delivers a series of upcounting signals UP, whereby up/down counter 40 is increased continuously. The sum formed by adder 50 is also increased thereby in corresponding manner, and the volume is also increased by volume control 2 in corresponding manner.

Thus, as a result, an increase in volume is reached in case of soft or quiet passages of a piece of music. At very loud passages of a piece of music, a decrease in volume takes place.

The invention is not limited to the embodiment described hereinbefore. There are several modifications possible, of which some shall be addressed briefly in the following:

The circuit shown in FIG. 1, comprising D/A converter 60, analog window comparator 30 and the line branch for the tracking signal N, which comes from low pass filter 20, can be replaced by the circuit shown in FIG. 2. The analog window comparator 30 is replaced by a digital comparator 70 which is capable of directly comparing the output signal of counter 40 with a digital signal obtained from tracking signal N by means of an analog to digital converter (A/D converter) 72.

Instead of the adder 50 shown in FIG. 1, a subtractor can be used as well. The counter then will have to be increased then in case of high audio signal levels and decreased in case of low audio signal levels, so that as a final result soft pieces of music are reproduced somewhat louder in relation and loud pieces of music somewhat lower in relation.

In a further modification, the adder 50 of FIG. 1 can be replaced by a multiplier that multiplies the digital setting signal on bus line 6 with the optionally linearly matched contents of counter 40 in such a manner that in the case of medium signal levels, for example, the value of the digital setting signal preset by digital bus control 4 is supplied to the volume control 9. In the case of low levels of the audio signal a multiplication by a value greater than 1 (for example 1.01 to 1.15) takes place in order to increase the volume. In the case of higher signal levels of the audio signal, a multiplication by a factor smaller than 1 (for example by a factor between 0.85 and 0.99) takes place in order to reduce the volume.

What is claimed is:

1. A signal compression method for an audio apparatus that contains a volume control inserted in the audio signal path and that is adjustable via a digital setting signal delivered by a digital controller, the method comprising:

a) branching off the audio signal from the audio signal path upstream of the volume control and processing the audio signal by a signal processing circuit so as to form a tracking signal that is dependent on the intensity of the audio signal;

b) comparing the tracking signal in a comparator with a reference value and generating a comparison result;

c) receiving the comparison result at a counter and increasing or decreasing the counter in response to the comparison result; and d) linking the contents of the counter with the digital setting signal before the setting signal is fed to the volume control and generating the reference value from only the contents of the counter.

2. The method of claim 1, wherein linking comprises receiving on a first input of an adder the digital setting signal and having on a second input of the adder the output of the counter, and raising the count of the counter in response to the output signal of the comparator when the tracking signal corresponds to a reduction of the level of the audio signal.

3. The method of claim 1, wherein linking comprises receiving on a first input of a subtractor the digital setting signal and having a second input coupled with the output of the counter, and lowering the count of the counter in response to the output signal of the comparator when the tracking signal corresponds to a reduction in the level of the audio signal.

4. A signal compressor for an audio apparatus having a volume control that is inserted in an audio signal path and is adjustable via a digital setting signal delivered by a digital controller, the compressor comprising:
 a signal processing circuit for receiving an audio signal from the audio signal path, the signal processing circuit configured to process the audio signal to form a tracking signal having characteristics conforming to the intensity of the audio signal;
 a comparator coupled to the signal processing circuit and configured to receive a reference value signal and the tracking signal and to generate a comparison result;
 a counter coupled to the comparator and configured to increase and decrease a count in response to the comparison result;
 a D/A converter coupled to the counter and configured to generate the reference value signal from only the contents of the counter; and
 an adder coupled to the counter and configured to link the contents of the counter with the digital setting signal before the digital setting signal is fed to the volume control.

5. The compressor of claim 4 wherein the adder is configured to receive on a first input the digital setting signal and on a second input an output of the counter, the counter configured to raise the count in response to the comparison result when the tracking signal corresponds to a reduction in the level of the audio signal.

6. The compressor of claim 4 wherein the adder is configured as a subtractor to receive on a first input the digital setting signal and on a second input the output of the counter, and the counter is configured to lower the count in response to the comparison result when the tracking signal corresponds to a reduction in the level of the audio signal.

7. The compressor of claim 4, wherein the comparator is configured as analog comparator having one input connected to an output of the counter via the D/A converter and another input connected to the output of the signal processing circuit.

8. The compressor of claim 4,
 wherein the comparator is configured as digital comparator having one input connected to the output of the signal processing circuit via an A/D converter and another input connected to the output of the counter.

9. The compressor of claim 4,
 wherein the output of the comparator is coupled to a counting direction terminal of the counter, and wherein the counter, in response to the audio signal intensity increasing or decreasing, is clocked with a clock signal having a first frequency and, respectively, a clock signal having a second frequency that is lower than the first frequency.

10. The compressor of claim 4,
 wherein the signal processing circuit comprises:
  a rectifier configured to rectify the audio signal and, as required, to add the separate signals for the left and the right channels;
  a logarithmic amplifier coupled to the output of the rectifier, and
  a low pass filter coupled to the output of the logarithmic amplifier.

11. A method for volume control of an audio signal, comprising:
 generating a tracking signal from the audio signal, the tracking signal having characteristics dependent on the volume intensity characteristics of the audio signal;
 generating a comparison signal from a comparison of the tracking signal and a reference signal;
 generating a counter signal responsive to the comparison signal and generating the reference signal from only the counter signal; and
 linking the counter signal to a digital setting signal to form a modified digital setting signal used to control a volume control device.

12. The method of claim 11 wherein the audio signal used to generate the tracking signal is taken upstream from the volume control device.

13. The method of claim 11 wherein generating a counter signal comprises increasing and decreasing a count in a counter in response to the comparison signal.

14. The method of claim 13 wherein increasing and decreasing the count in a counter comprises linking the counter signal to the digital setting signal via an adder wherein the counter signal increases in count when the tracking signal characteristics correspond to a reduction in the volume intensity characteristics of the audio signal.

15. The method of claim 13 wherein increasing and decreasing the count in a counter comprises linking the counter signal to the digital setting signal via a subtractor wherein the counter signal decreases in count when the tracking signal characteristics correspond to a reduction in the volume intensity characteristics of the audio signal.

16. The method of claim 13 wherein increasing and decreasing the count in a counter comprises clocking the counter with the first signal at a first frequency in response to a comparison signal and clocking the counter with a second clock signal at a second clock frequency in response to the comparison signal.

17. A signal compressor circuit, comprising:
 an audio signal processing circuit having an input terminal coupled to an audio signal source and configured to generate a tracking signal that is responsive to the volume intensity of the audio signal;
 a comparator configured to compare the tracking signal to a reference signal and to generate a comparison signal;
 a counter circuit coupled to the audio signal processing circuit and configured to increase and decrease a counter in response to the comparison signal;
 a D/A converter coupled to the counter circuit and configured to generate the reference signal from only the contents of the counter circuit; and
 a linking circuit for linking a digital volume setting signal with the counter to modify the digital volume setting signal.

18. The circuit of claim 17 wherein the counter circuit comprises a counter configured to generate a counter value and a comparator circuit.

19. The circuit of claim 18 wherein the linking circuit comprises an adder coupled to the counter and configured to receive the digital volume setting signal, the counter circuit configured to increase the counter value in response to the comparison signal when the tracking signal corresponds to a reduction of volume intensity level of the audio signal.

20. The circuit of claim 18 wherein the linking circuit comprises a subtractor coupled to the counter circuit and configured to receive the digital volume setting signal, the counter circuit configured to decrease the counter value in response to the comparison signal when the tracking signal corresponds to a reduction in volume intensity level of the audio signal.

21. The circuit of claim 18 wherein the counter is clocked with a first frequency in response to one of either an increase and decrease in the counter value and is clocked with a second frequency that is lower than the first frequency in response to the other of an increase and decrease in the counter value.

22. The circuit of claim 18 wherein the comparator comprises an analog comparator having one input connected to an output of a D/A converter receiving a signal from the counter and a second input connected to the output of the signal processing circuit.

23. The circuit of claim 18 wherein the comparator comprises a digital comparator having one input coupled to the output of an A/D converter that receives as its input the output of the signal processing circuit, the comparator having another input connected to the output of the counter.

24. A circuit for preventing amplitude clipping of a useful signal, the amplitude of which enters into the range of the positive or negative voltage value of a voltage supply source, the circuit comprising:

a signal compressor configured to receive the useful signal, the compressor comprising:
   a signal processing circuit having an input terminal coupled to a signal source of the useful signal and configured to generate a tracking signal that is responsive to the voltage level of the useful signal;
   a comparator configured to compare the tracking signal to a reference signal and to generate a comparison signal;
   a counter circuit coupled to the signal processing circuit and configured to increase and decrease a counter in response to the comparison signal;
   a linking circuit for linking a signal setting signal with the counter to adjust the voltage level of the useful signal; and
   a D/A converter coupled to the counter circuit and configured to generate the reference signal using only the contents of the counter circuit;

the circuit further comprising a device having an input coupled to a branched-off portion of the useful signal that has not been passed through the signal compressor, the device configured to generate a harmonic distortion signal that is received by the signal compressor and used to control the degree of voltage level adjustment of the useful signal.

* * * * *

UNITED STATES PATENT AND TRADEMARK OFFICE
CERTIFICATE OF CORRECTION

PATENT NO. : 6,473,662 B2  
DATED : October 29, 2002  
INVENTOR(S) : Jürgen Lübbe et al.

It is certified that error appears in the above-identified patent and that said Letters Patent is hereby corrected as shown below:

<u>Title page,</u>
Item [56], FOREIGN PATENT DOCUMENTS, "33 20 670 A" should read as
-- 32 20 670 A --.

Signed and Sealed this

First Day of April, 2003

JAMES E. ROGAN
*Director of the United States Patent and Trademark Office*